(12) United States Patent
Hachiya et al.

(10) Patent No.: US 11,955,558 B2
(45) Date of Patent: Apr. 9, 2024

(54) DISPLAY DEVICE

(71) Applicant: SHARP KABUSHIKI KAISHA, Sakai (JP)

(72) Inventors: Atsushi Hachiya, Sakai (JP); Hiroaki Furukawa, Sakai (JP); Yuhichi Saitoh, Sakai (JP); Tomohisa Aoki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 395 days.

(21) Appl. No.: 17/603,535

(22) PCT Filed: Apr. 26, 2019

(86) PCT No.: PCT/JP2019/018024
§ 371 (c)(1),
(2) Date: Oct. 13, 2021

(87) PCT Pub. No.: WO2020/217478
PCT Pub. Date: Oct. 29, 2020

(65) Prior Publication Data
US 2022/0157996 A1 May 19, 2022

(51) Int. Cl.
H01L 27/14 (2006.01)
H01L 29/786 (2006.01)
H10K 59/121 (2023.01)
H10K 59/131 (2023.01)

(52) U.S. Cl.
CPC .... *H01L 29/78672* (2013.01); *H01L 29/7869* (2013.01); *H10K 59/1213* (2023.02); *H10K 59/1216* (2023.02); *H10K 59/131* (2023.02)

(58) Field of Classification Search
CPC ........... H01L 29/78672; H01L 29/7869; H01L 27/124; H01L 27/1248; H01L 29/41733; H01L 27/1225; H10K 59/1213; H10K 59/1216; H10K 59/131; H10K 59/1201
USPC ............................................ 257/288, 59, 72
See application file for complete search history.

(56) References Cited

U.S. PATENT DOCUMENTS

| 11,476,314 B2* | 10/2022 | Honjo ................. H01L 27/1237 |
| 2005/0151276 A1 | 7/2005 | Jang et al. |
| 2013/0069055 A1 | 3/2013 | Yamazaki et al. |
| 2015/0243220 A1 | 8/2015 | Kim et al. |
| 2015/0348997 A1 | 12/2015 | Sasagawa et al. |
| 2016/0351122 A1 | 12/2016 | Jung et al. |
| 2016/0351589 A1 | 12/2016 | Sasagawa et al. |
| 2017/0278916 A1 | 9/2017 | Maruyama |
| 2019/0165071 A1 | 5/2019 | Maruyama |
| 2021/0083029 A1 | 3/2021 | Maruyama |

FOREIGN PATENT DOCUMENTS

| JP | 2005-203780 A | 7/2005 |
| JP | 2013-084925 A | 5/2013 |
| JP | 2016-006871 A | 1/2016 |
| JP | 2017-173505 A | 9/2017 |
| JP | 2018-195747 A | 12/2018 |

* cited by examiner

*Primary Examiner* — Tan N Tran
(74) *Attorney, Agent, or Firm* — ScienBiziP, P.C.

(57) ABSTRACT

One conductor region of a crystalline silicon semiconductor layer in a first transistor is electrically connected to one conductor region of an oxide semiconductor layer in a second transistor through a first contact hole and a second contact hole communicating with each other.

14 Claims, 14 Drawing Sheets

DISPLAY DEVICE

TECHNICAL FIELD

The disclosure relates to a display device.

BACKGROUND ART

Patent Document 1 discloses a semiconductor circuit including: a transistor containing a silicone semiconductor layer; and another transistor containing an oxide semiconductor layer. The transistors are formed on a single substrate.

CITATION LIST

Patent Literature

[Patent Document 1] Japanese Unexamined Patent Application Publication No. 2018-195747

SUMMARY

Technical Problem

In connecting two kinds of transistors whose channels are made of different materials, if a bridge wiring structure is utilized to connect together a conducting electrode of one transistor and a conducting electrode of another transistor, the size of the circuit becomes inevitably large.

Solution to Problem

A display device according to an aspect of the disclosure includes: a first transistor; a second transistor; a first inorganic insulating film; and a second inorganic insulating film, all of which are provided above a substrate. The first transistor includes: a crystalline silicon semiconductor layer; a first gate insulating film provided on the crystalline silicon semiconductor layer; and a first gate electrode provided on the first gate insulating film, and positioned across the first gate insulating film from the crystalline silicon semiconductor layer. The second transistor includes: an oxide semiconductor layer; a second gate insulating film provided on the oxide semiconductor layer; and a second gate electrode provided on the second gate insulating film, and positioned across the second gate insulating film from the oxide semiconductor layer. The first inorganic insulating film is provided on the first gate insulating film and the first gate electrode, and is positioned below the oxide semiconductor layer. The second inorganic insulating film is provided on the first inorganic insulating film and the oxide semiconductor layer, and is positioned above the second gate electrode. The first gate insulating film and the first inorganic insulating film are provided with a first contact hole. The second inorganic insulating film is provided with a second contact hole surrounding the first contact hole in plan view. The first contact hole and the second contact hole are provided with a connection wire, and are in shared use between the first transistor and the second transistor. The connection wire electrically connects together one of conductor regions of the crystalline silicon semiconductor layer in the first transistor and one of conductor regions of the oxide semiconductor layer in the second transistor.

Advantageous Effects of Disclosure

Thanks to an aspect of the disclosure, the first transistor and the second transistor whose channels are made of different materials are electrically connected through the first contact hole and the second contact hole. Such a feature can reduce an area of the circuit.

DESCRIPTION OF EMBODIMENTS

FIG. 1(a) is a schematic plan view illustrating a configuration of a display device in embodiments. FIG. 1(b) is a cross-sectional view illustrating the configuration of the display device.

Figure 1:
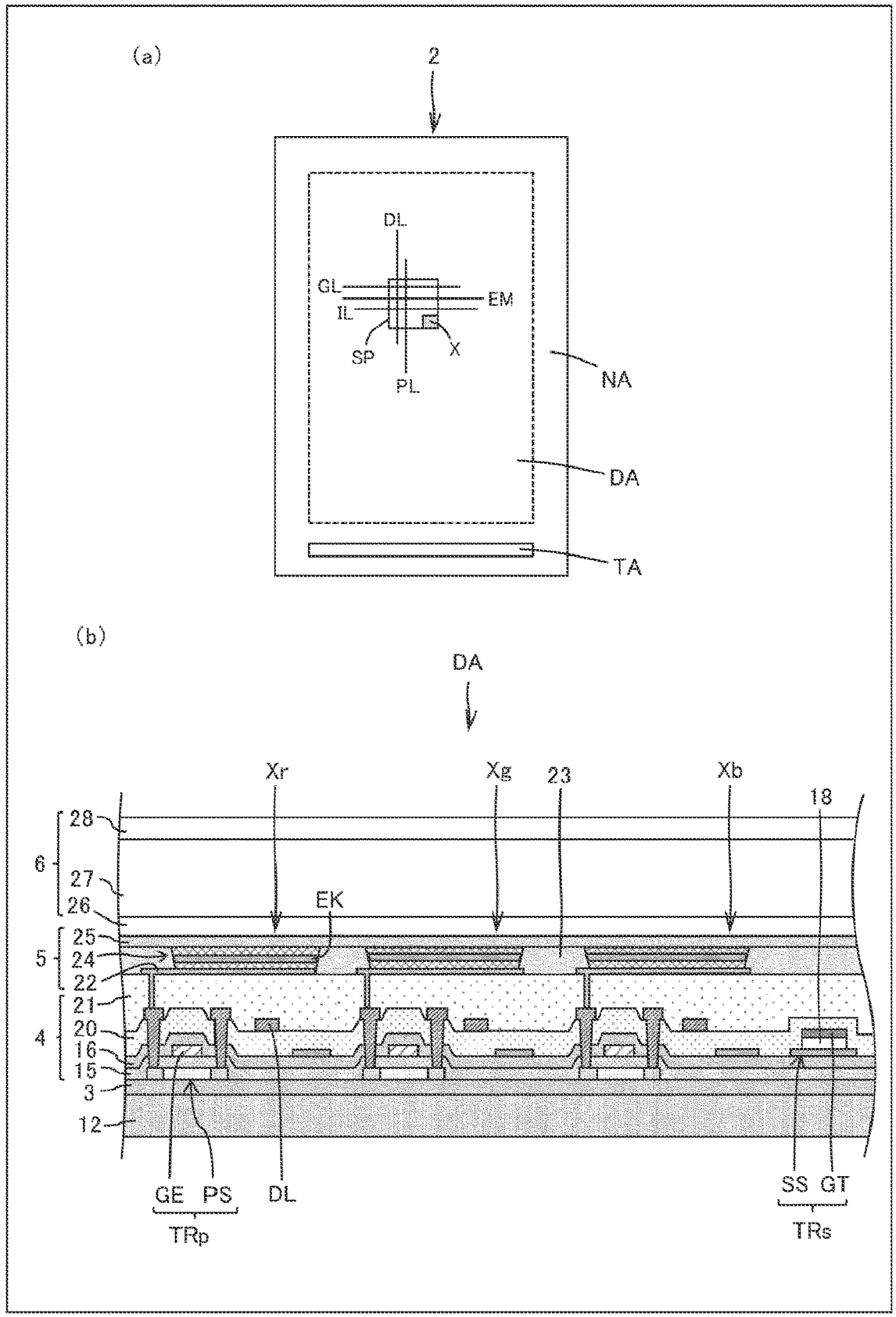
FIG. 1(a) is a schematic plan view illustrating a configuration of a display device in embodiments.
FIG. 1(b) is a cross-sectional view illustrating the configuration of the display device.

As illustrated in FIG. 1, a display device 2 includes: a barrier layer 3; a thin-film transistor (TFT) layer 4; a light-emitting element layer 5 of a top-emission type (i.e. emitting light upwards); and a sealing layer 6, all of which are formed on a substrate 12 in the stated order. The display device 2 includes a display region DA in which a plurality of sub-pixels SP are formed. Each of the sub-pixels SP includes a light-emitting element X. The display region DA is surrounded with a frame region NA provided with a terminal unit TA.

The substrate 12 is a glass substrate or a flexible base material mainly made of such resin as polyimide. The substrate 12 can be formed of, for example, two polyimide films and an inorganic film sandwiched therebetween. The barrier layer (an undercoat layer) 3 is an inorganic insulating layer blocking intrusion of such foreign objects as water and oxygen. The barrier layer 3 can be formed of, for example, silicon nitride and silicon oxide.

As illustrated in FIG. 1(b), the thin-film transistor layer 4 includes: a crystalline silicon semiconductor layer PS above the barrier layer 3; a first gate insulating film 15 above the crystalline silicon semiconductor layer PS; a first metal layer (including a gate electrode GE) above the first gate insulating film 15; a first inorganic insulating film 16 above the first metal layer; an oxide semiconductor layer SS above the first inorganic insulating film 16; a second gate insulating layer 18 above the oxide semiconductor layer SS; a second metal layer (including a gate electrode GT) above the second gate insulating film 18; a second inorganic insulating film 20 above the second metal layer; a third metal layer (including a data signal line DL) above the second inorganic insulating film 20; and a planarization film 21 above the third metal layer.

The crystalline silicon semiconductor layer PS is made of, for example, low-temperature polysilicon (LTPS). The oxide semiconductor layer is made of oxygen and at least one of elements selected from among, for example, indium (In), gallium (Ga), tin (Sn), hafnium (Hf), zirconium (Zr), and zinc (Zn). Specifically, the oxide semiconductor layer can be made of such materials as: an oxide semiconductor (In-GaZnO) containing indium (In), gallium (Ga), zinc (Zn), and oxygen; an oxide semiconductor (InSnZnO) containing indium (In), tin (Sn), zinc (Zn), and oxygen; an oxide semiconductor (InZrZnO) containing indium (In), zirconium (Zr), zinc (Zn), and oxygen; and an oxide semiconductor (InHfZnO) containing indium (In), hafnium (Hf), zinc (Zn), and oxygen.

In FIG. 1(b), a first transistor TRp includes the gate electrode GE and the crystalline silicon semiconductor layer PS, and a second transistor TRs includes the gate electrode GT and the oxide semiconductor layer SS.

Each of the first metal layer, the second metal layer, and the third metal layer is a monolayer film made of at least one of such metals as, for example, aluminum, tungsten, molybdenum, tantalum, chromium, titanium, and copper, or a multilayer film formed of these metals.

Each of the first gate insulating film 15, the first inorganic insulating film 16, the second gate insulating film 18, and the second inorganic insulating film 20 can be a silicon oxide (SiOx) film, or a silicon nitride (SiNx) film formed by, for example, chemical vapor deposition (CVD). Alternatively, each of the films 15, 16, 18, and 20 can be a multilayer film containing a SiOx film and a SiNx film. The planarization film 21 can be formed of, for example, such an applicable organic material as polyimide and acrylic resin.

The light-emitting element layer 5 includes: a first electrode (a lower electrode) 22 above the planarization film 21; an edge cover film 23, of insulation, covering an edge of the first electrode 22; an electroluminescence (EL) layer 24 above the edge cover film 23; and a second electrode (an upper electrode) 25 above the EL layer 24. The edge cover film 23 is made of, for example, such an organic material as polyimide and acrylic resin. The organic material is applied and then patterned by photolithography to form the edge cover film 23.

As illustrated in FIG. 1, the light-emitting element layer 5 includes, for example, a light-emitting element Xr (red), a light-emitting element Xg (green), and a light-emitting element Xb (blue). Each of the light-emitting elements includes: the first electrode 22 and the EL layer 24 (including a light-emitting layer EK) each shaped into an island; and the second electrode 25. The second electrode 25 is a common electrode shaped into a monolithic form in common among the light-emitting elements.

Each of the light-emitting elements Xr, Xg, and Xb may be, for example, an organic light-emitting diode (OLED) including an organic layer as a light-emitting layer, or a quantum-dot light-emitting diode (QLED) including a quantum-dot layer as a light-emitting layer.

The EL layer 24 includes a hole-injection layer, a hole-transport layer, the light-emitting layer EK, an electron-transport layer, and an electron-injection layer stacked on top of another in the stated order from below. Utilizing, for example, vapor deposition, ink-jet printing, or photolithography, the light-emitting layer is formed to have a shape of an island at an opening (for each of the sub-pixels) of the edge cover film 23. The other layers are shaped into islands or a monolithic form (a common layer). The EL layer 24 may omit one or more of the hole-injection layer, the hole-transport layer, the electron-transport layer, and the electron-injection layer.

The first electrode 22 (an anode), which reflects light, is formed of, for example, a stack of indium tin oxide (ITO) and either silver (Ag) or an alloy containing Ag. The second electrode 25 (a cathode), which is transparent to light, is formed of, for example, a thin film made of such metal as an alloy of magnesium and silver.

If the light-emitting elements Xr, Xg, and Xb are each an OLED, holes and electrons recombine together in the light-emitting layer EK by a drive current between the first electrode 22 and the second electrode 25, which forms an exciton. While the exciton transforms to the ground state, light is released. If the light-emitting elements Xr, Xg, and Xb are each a QLED, holes and electrons recombine together in the light-emitting layer EK by a drive current between the first electrode 22 and the second electrode 25, which forms an exciton. While the exciton transforms from the conduction band level to the valence band level, light is released.

In FIG. 1(b), the sealing layer 6 covering the light-emitting element layer 5 prevents such foreign objects as water and oxygen from penetrating into the light-emitting element layer 5. The sealing layer 6 can include, for example: two layers of inorganic sealing films 26 and 28; and an organic film 27 formed therebetween.

Figure 2:
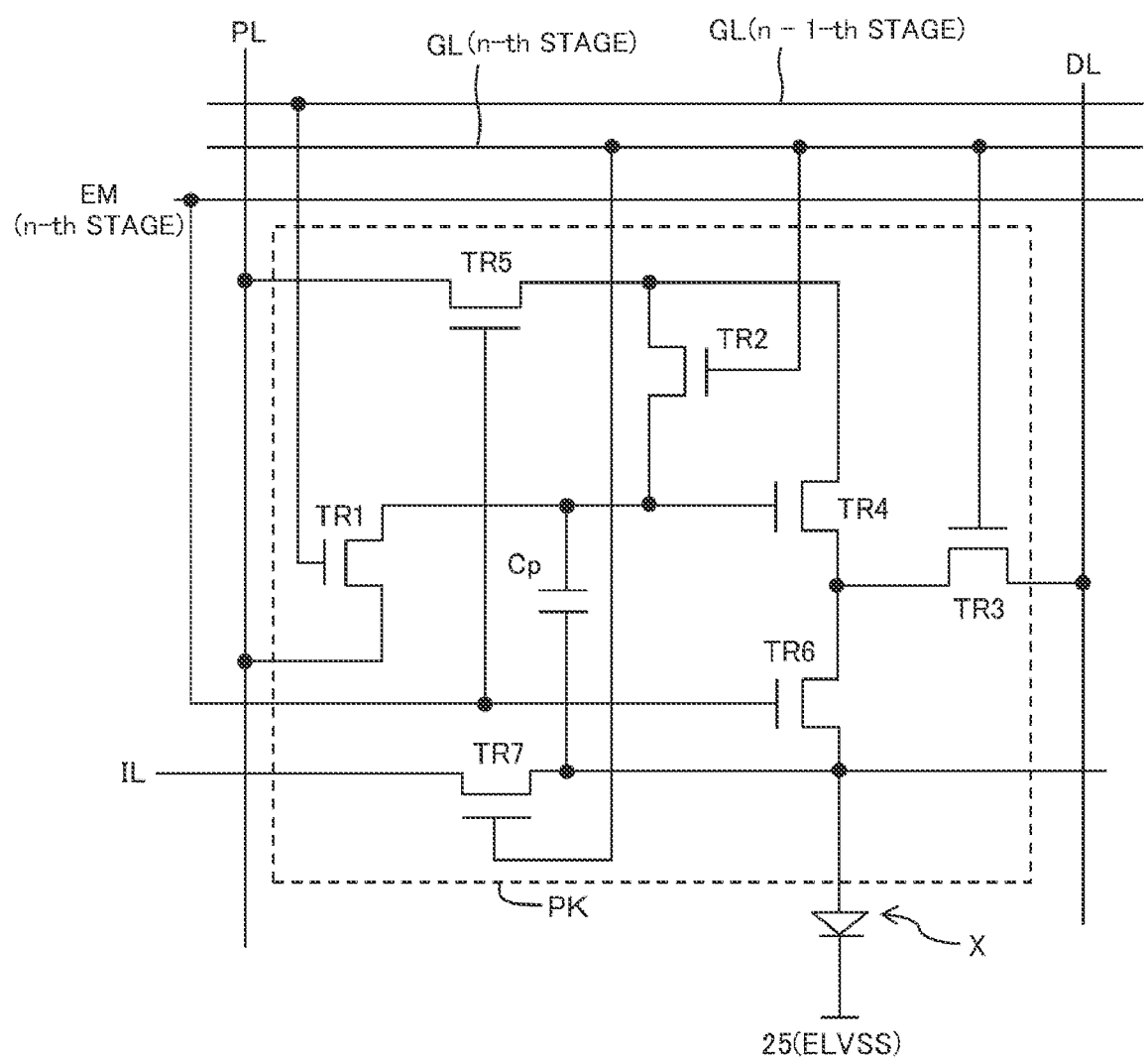
FIG. 2 is a circuit diagram illustrating an example of a pixel circuit.

FIG. 2 is a circuit diagram illustrating an example of a pixel circuit. In the display region DA of FIG. 1, a light-emitting element X and a pixel circuit PK of the light-emitting element X are provided for each of sub-pixels SP. This pixel circuit PK and a wire connected to the pixel circuit PK are formed in the thin-film transistor layer 4.

The pixel circuit PK in FIG. 2 includes: a capacitance element Cp; a first initialization transistor TR1 having a gate terminal connected to a scan signal line GL at a previous stage (n−1-th stage); a threshold control transistor TR2 having a gate terminal connected to a scan signal line GL at the stage of the threshold control transistor TR2 itself (n-th stage); a write control transistor TR3 having a gate terminal connected to the scan signal line GL at the stage of the write control transistor TR3 itself (n-th stage); a drive transistor TR4 controlling a current of the light-emitting element X; a power source supply transistor TR5 having a gate terminal connected to a light-emission control line EM; a light-emission control transistor TR6 having a gate terminal connected to the light-emission control line EM; and a second initialization transistor TR7 having a gate terminal connected to the scan signal line GL at the stage of the second initialization transistor TR7 itself (n-th stage).

The drive transistor TR4 has a gate terminal connected to an anode of the light-emitting element X through the capacitance element Cp, and to a high-voltage power source line PL through the first initialization transistor TR1. The drive transistor TR4 has a source terminal connected to the data signal line DL through the write control transistor TR3, and to the anode of the light-emitting element X through the light-emission control transistor TR6. The drive transistor TR4 has a drain terminal connected to the gate terminal of the drive transistor TR4 through the threshold control transistor TR2, and to the high-voltage power source line PL through the power source supply transistor TR5. The anode of the light-emitting element X is connected to the initialization power source line IL through the second initialization transistor TR7. The initialization power source line IL and a cathode 25 (a common electrode) of the light-emitting element X are supplied with a low-voltage power source.

First Embodiment

FIG. 3(a) is a cross-sectional view illustrating a configuration of a display device in a first embodiment. FIG. 3(b) is a plan view illustrating the configuration of the display device in the first embodiment.

Figure 3:
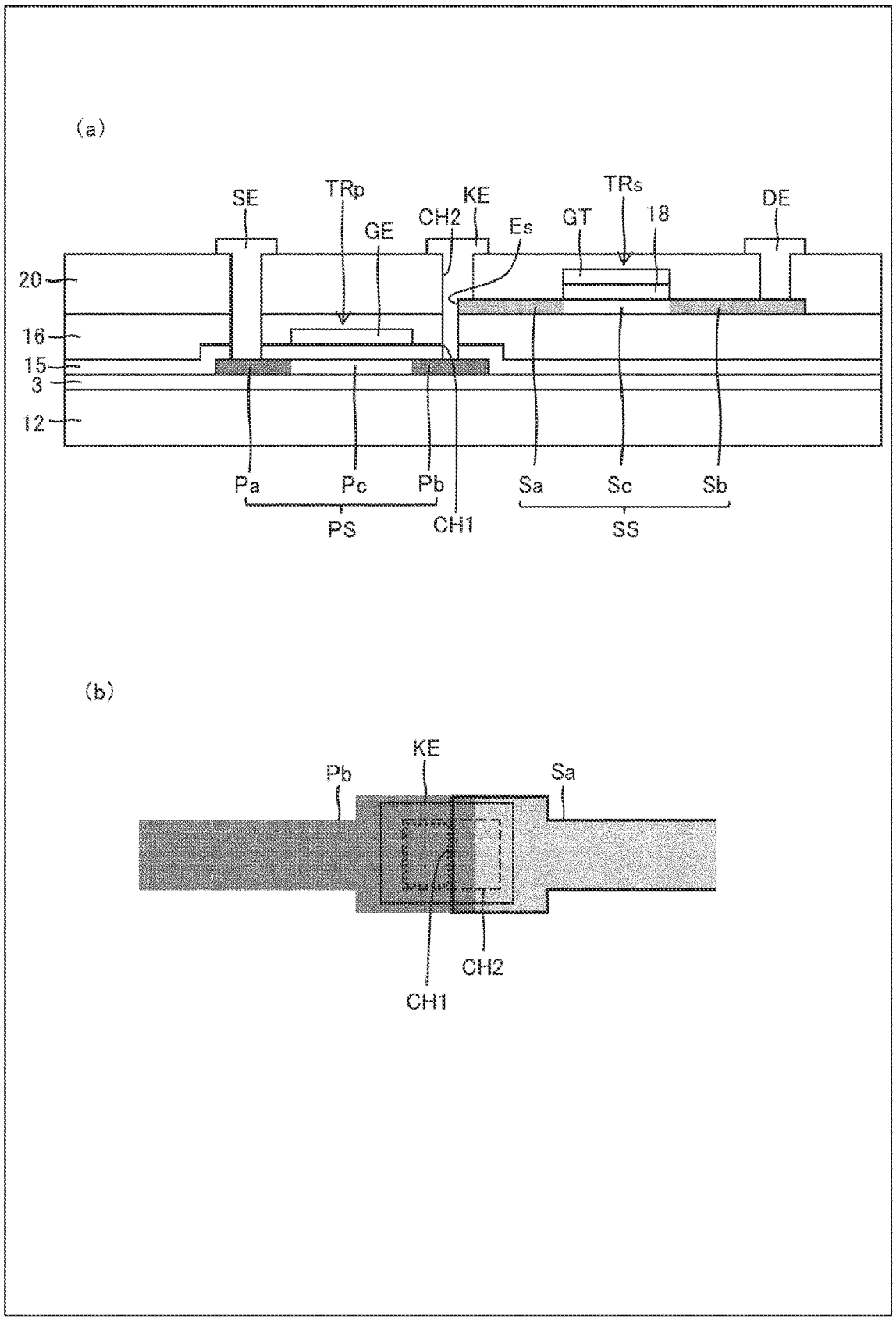
FIG. 3(a) is a cross-sectional view illustrating a configuration of a display device in a first embodiment.
FIG. 3(b) is a plan view illustrating the configuration of the display device in the first embodiment.

In FIG. 3, provided above the substrate 12 are the first transistor TRp and the second transistor TRs both of which are of the top-gate type. The first transistor TRp includes: the crystalline silicon semiconductor layer PS; the first gate insulating film 15 provided on the crystalline silicon semiconductor layer PS; and the first gate electrode GE provided on the first gate insulating film 15, and positioned across the first gate insulating film 15 from the crystalline silicon semiconductor layer PS. The second transistor TRs includes: the oxide semiconductor layer SS; the second gate insulating film 18 provided on the oxide semiconductor layer SS; and the second gate electrode GT provided on the second gate insulating film 18, and positioned across the second gate insulating film 18 from the oxide semiconductor layer SS.

The first inorganic insulating film 16 is provided on the first gate insulating film 15 and the first gate electrode GE, and is positioned below the oxide semiconductor layer SS. The second inorganic insulating film 20 is provided on the first inorganic insulating film 16 and the oxide semiconductor layer SS, and is positioned above the second gate electrode 18.

The first gate insulating film 15 and the first inorganic insulating film 16 are provided with a first contact hole CH1. The second inorganic insulating film 20 is provided with a second contact hole CH2 surrounding the first contact hole CH1 in plan view.

The crystalline silicon semiconductor layer PS of the first transistor TRp includes: a channel region Pc matching the first gate electrode GE; and two conductor regions (i.e. regions lower in resistance than the channel region Pc) Pa and Pb holding the channel region Pc. The oxide semiconductor layer SS of the second transistor TRs includes: a channel region Sc matching the second gate electrode GT; and two conductor regions (i.e. regions lower in resistance than the channel region Sc) Sa and Sb holding the channel region Sc. Note that the conductor regions Pa and Pb of the first transistor TRp and the conductor regions Sa and Sb of the second transistor TRs are referred to as conducting terminals in description of a pixel circuit.

The third metal layer is provided with a connection wire KE to cover the first contact hole CH1 and the second contact hole CH2. The first contact hole CH1 and the second contact hole CH2 provided with the connection wire KE are in shared use between the first transistor TRp and the second transistor TRs. The connection wire KE electrically connects together the conductor region Pb and the conductor region Sa. The conductor region Pb is one of the conductor regions of the crystalline silicon semiconductor layer PS. The conductor region Sa is one of the conductor regions of the oxide semiconductor layer SS.

Specifically, the connection wire KE is in contact with the conductor region Pb exposed on a bottom of the first contact hole CH1, and with the conductor region Sa exposed on a bottom of the second contact hole CH2. In plan view, the conductor region Pb and the conductor region Sa overlap, and an edge Es of the conductor region Sa coincides with the second contact hole CH2. The connection wire KE is formed inside the first contact hole CH1 and the second contact hole CH2 communicating with each other. The connection wire KE is in contact with the edge Es (an end face) and a top face of the conductor region Sa, and with a top face of the conductor region Pb. The edge Es (the end face) of the conductor region Sa and a side wall of the first contact hole CH1 are substantially flush with each other.

The conductor region Pa; that is, another one of the conductor regions in the crystalline silicon semiconductor layer PS, is connected to a source electrode SE. The conductor region Sb; that is, another one of the conductor regions in the oxide semiconductor layer SS, is connected to a drain electrode DE. The connection wire KE functions as a wire to electrically connect together the conductor region Pb; that is, one of the conductor regions in the first transistor TRp, and the conductor region Sa; that is, one of the conductor regions in the second transistor TRs.

The first embodiment prevents formation of a heterojunction interface on which the crystalline silicon semiconductor layer PS and the oxide semiconductor layer SS are in direct contact with each other, making it possible to avoid an increase in resistance due to formation of a depletion layer. Such an advantageous effect is particularly remarkable when the crystalline silicon semiconductor layer PS is of a p-type and the oxide semiconductor layer SS is used.

Moreover, the conductor region Pb of the crystalline silicon semiconductor layer PS and the conductor region Sa of the oxide semiconductor layer SS are electrically connected together through the first contact hole CH1 and the second contact hole CH2 communicating with each other (common contact holes). Compared with a case of forming a bridge wiring structure, such a feature makes it possible to reduce an area of the circuit.

Figure 4:
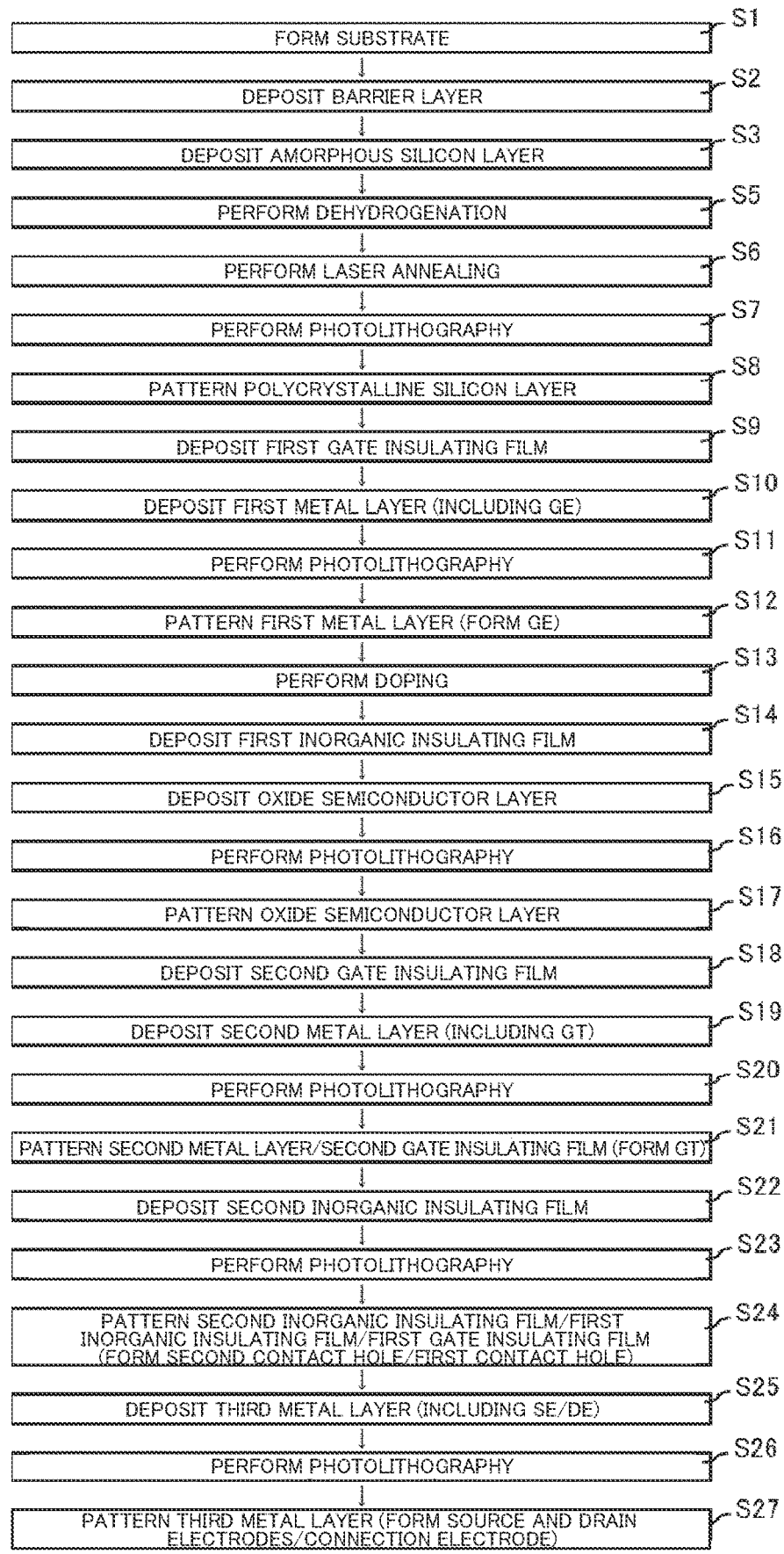
FIG. 4 is a flowchart showing how to produce the display device in the first embodiment.
Figure 5:
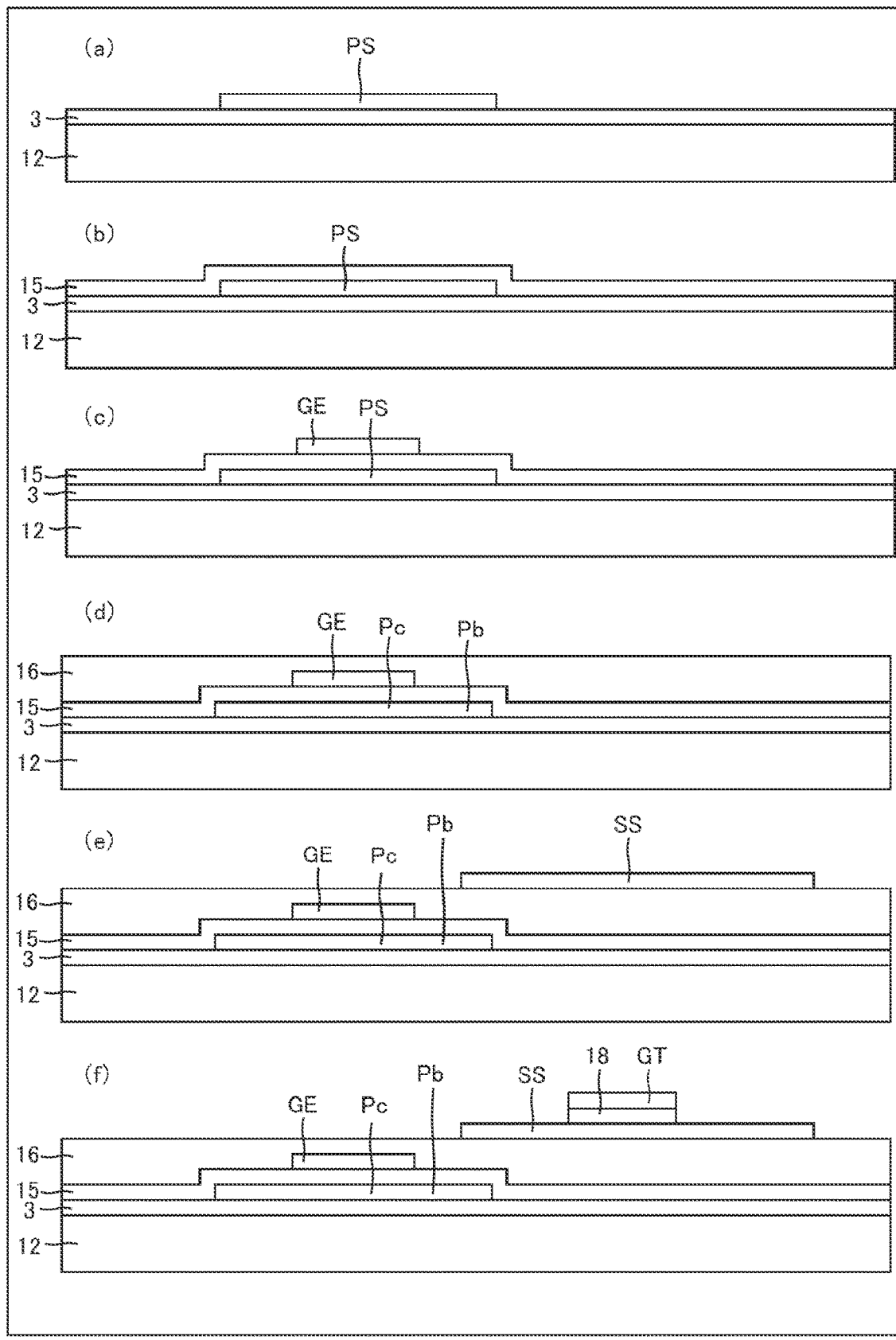
FIG. 5 is a cross-sectional view illustrating how to produce the display device in the first embodiment.
Figure 6:
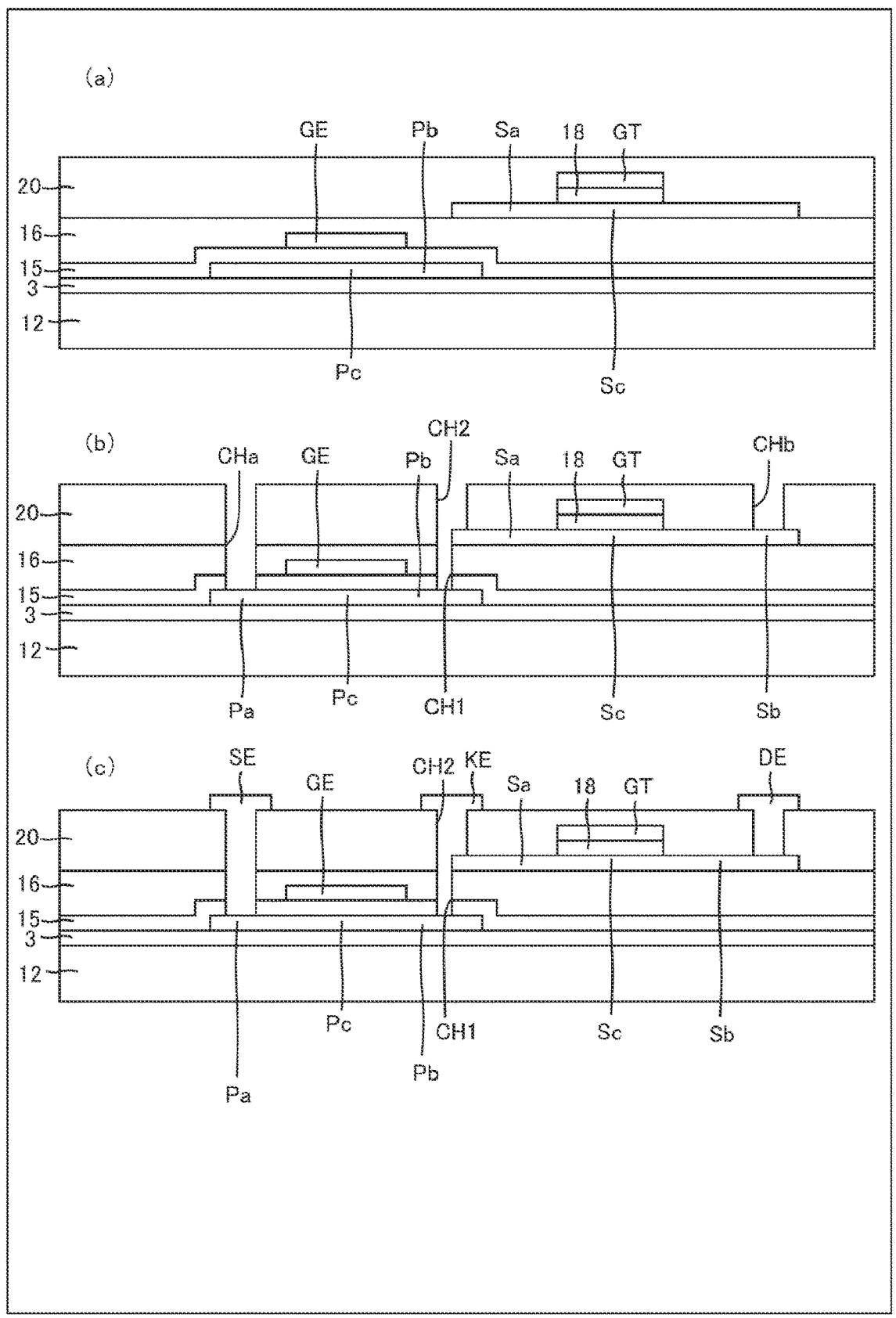
FIG. 6 is a cross-sectional view illustrating how to produce the display device in the first embodiment.

FIG. 4 is a flowchart showing how to produce the display device in the first embodiment. FIGS. 5 and 6 are cross-sectional views illustrating how to produce the display device in the first embodiment. At Step S1, the substrate 12, which is flexible, is formed of polyimide as a main ingredient. At Step S2, the barrier layer 3 is deposited. At Step S3, an amorphous semiconductor layer is deposited.

At Step S5, dehydrogenation is performed. At Step S6, laser annealing is performed. At Step S7, photolithography is performed. At Step S8, a polycrystalline silicon layer is patterned to form a polycrystalline silicon semiconductor layer PS (see FIG. 5(a)). At Step S9, the first gate insulating film 15 is deposited (see FIG. 5(b)).

At Step S10, the first metal layer (including the GE) is deposited. At Step S11, photolithography is performed. At Step S12, the first metal layer is patterned to form the first gate electrode GE (see FIG. 5(c)). At Step S13, the polycrystalline silicon semiconductor layer PS is doped. Doped here is an end of the polycrystalline silicon semiconductor layer PS (i.e. a portion not facing the first gate electrode GE). The doped end forms the conductor region Pb and the channel region Pc. At Step S14, the first inorganic insulating film 16 is deposited (see FIG. 5(d)).

At Step S15, the oxide semiconductor layer SS is deposited. At Step S16, photolithography is performed. At Step S17, the oxide semiconductor layer SS is patterned (FIG. 5(e)). Here, an end of the oxide semiconductor layer SS is positioned to overlap the end (the conductor region Pb) of the polycrystalline silicon semiconductor layer PS.

At Step S18, the second gate insulating film 18 is deposited. At Step S19, the second metal layer (including the GT) is deposited. At Step S20, photolithography is performed. At Step S21, the second metal layer and the second gate insulating film 18 are patterned to form the second gate electrode GT (see FIG. 5(f)).

At Step S22, the second inorganic insulating film 20 is deposited (see FIG. 6(a)). Here, the end of the oxide semiconductor layer SS (i.e. a portion not facing the second gate electrode GT) is reduced to form the conductor region Sa and the channel region Sc. At Step S23, photolithography is performed.

At Step S24, the second inorganic insulating film 20, the first inorganic insulating film 16, and the first gate insulating film 15 are patterned, and the second contact hole CH2 and the first contact hole CH1 are formed (FIG. 6(b)). Here, an end face and a top face of the conductor region Sa of the oxide semiconductor layer SS and a top face of the conductor region Pb of the polycrystalline silicon semiconductor layer PS are exposed inside the first contact hole CH1 and the second contact hole CH2 communicating with each other. Furthermore, at Step S24, a contact hole CHa and a contact hole CHb are formed. The contact hole CHa exposes a top face of the conductor region Pa of the polycrystalline silicon semiconductor layer PS. The contact hole CHb exposes a top face of the conductor region Sb of the oxide semiconductor layer SS.

At Step S25, the third metal layer (including the SE, the DE, and the KE) is deposited. At Step S26, photolithography is performed. At Step S27, the third metal layer is patterned (FIG. 6(c)). Formed here are the source electrode SE covering the contact hole CHa, the drain electrode DE covering the contact hole CHb, and the connection wire KE covering the first contact hole CH1 and the second contact hole CH2. Hence, the connection wire KE comes into contact with the top face of the conductor region Pb, and with the end face and the top face of the conductor region Sa. Thus, the connection wire KE electrically connects together the conductor region Pb and the conductor region Sa.

Figure 7:
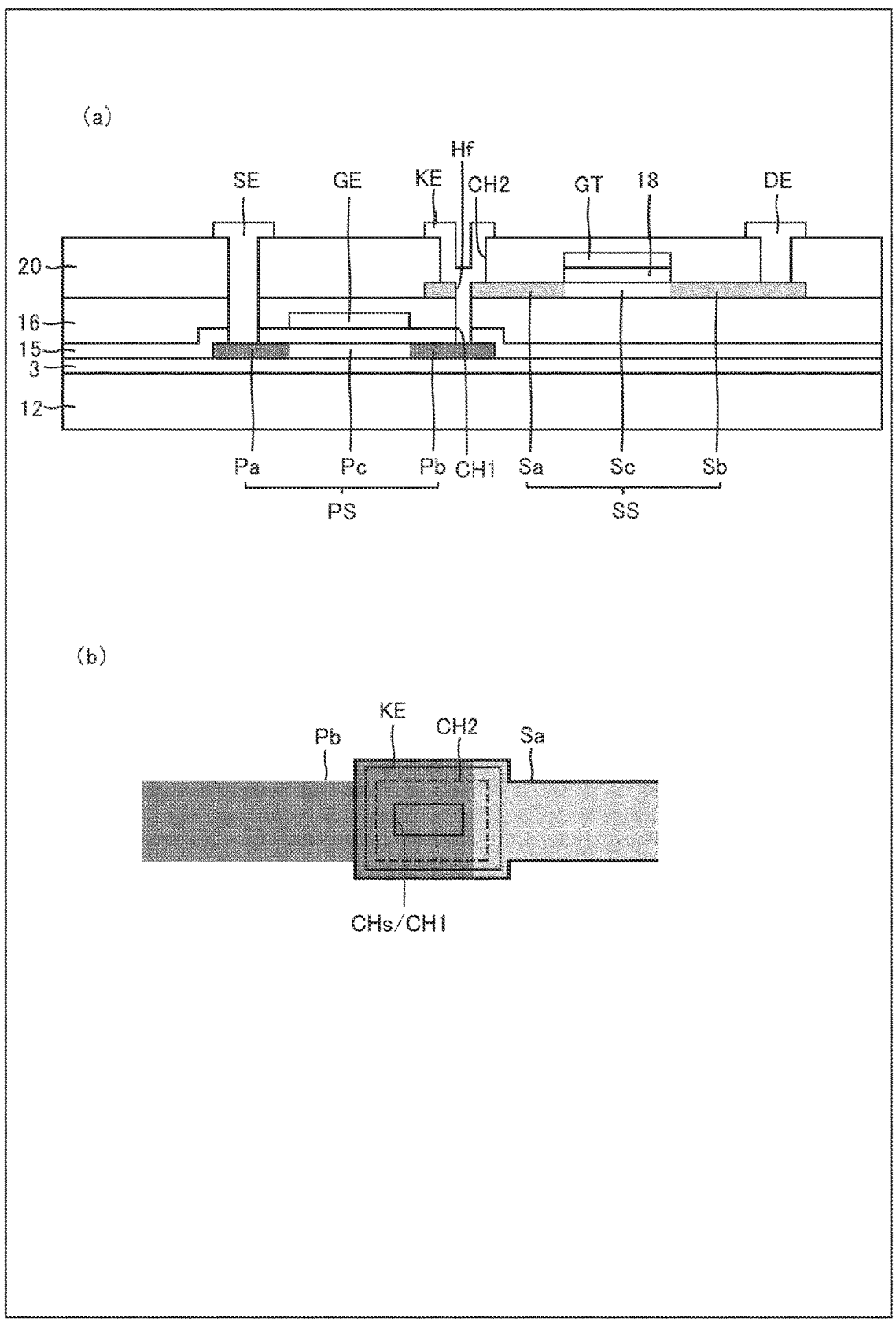
FIG. 7(a) is a cross-sectional view illustrating a modification in the first embodiment.
FIG. 7(b) is a plan view illustrating the modification in the first embodiment.

FIG. 7(a) is a cross-sectional view illustrating a modification in the first embodiment. FIG. 7(b) is a plan view illustrating the modification in the first embodiment. In FIG. 7, the conductor region Sa, of the oxide semiconductor layer SS, exposed in the second contact hole CH2 is provided with a first opening Hf matching the first contact hole CH1.

In plan view, each of the first contact hole CH1 and the first opening Hf fits inside the contact hole CH2. The first contact hole CH1 overlaps the conductor region Pb of the crystalline silicon semiconductor layer PS. The second contact hole CH2 overlaps the conductor region Sa of the oxide semiconductor layer SS. The connection wire KE is formed to cover the first contact hole CH1, the first opening Hf, and the second contact hole CH2 communicating with one another. The connection wire KE is in contact with the top faces of the respective conductor regions Sa and Pb. Hence, the connection wire KE electrically connects together the conductor region Pb of the crystalline silicon semiconductor layer PS and the conductor region Sa of the oxide semiconductor layer SS.

The first opening Hf is formed at Step S17 in FIG. 4. When the first contact hole CH1 is formed at Step S24, the oxide semiconductor layer SS having the first opening Hf substantially acts as a mask, so that the first contact hole CH1 is formed in the first gate insulating film 15 and the first inorganic insulating film 16. That is, the matching between the first contact hole CH1 and the first opening Hf does not mean precise matching, and allows a displacement ranging from approximately 1 to 3 μm due to a difference in etching rate.

When the first transistor TRp and the second transistor TRs are used for the pixel circuit PK in FIG. 2, the first transistor TRp of the n-type is desirably used as the drive transistor TR4, and the second transistor TRs of the n-type is desirably used as the first initialization transistor TR1, the threshold control transistor TR2, and the second initialization transistor TR7. Having a conducting terminal to connect to the capacitance element Cp, each of the first initialization transistor TR1, the threshold control transistor TR2, and the second initialization transistor TR7 may preferably be the second transistor TRs whose current leakage is small when turned OFF.

The first transistor TRp may be of the p-type. Alternatively, the first transistor TRp may preferably be of the n-type because the n-type first transistor TRp can share, for example, the scan signal line GL with the n-type second transistor TRs.

The transistors included in the pixel circuit PK shall not be limited in particular to the first transistor TRp or the second transistor TRs. The drive transistor TR4 may preferably be the first transistor TRp whose threshold shift is small. A transistor to be connected to the capacitance element Cp is preferably the second transistor TRs whose current leakage is small when turned OFF. For example, in the pixel circuit PK, either the initialization transistor TR1 having one of conducting terminals connected to the capacitance element Cp, or the threshold control transistor TR2 having one of conducting terminals connected to the capacitance element Cp may preferably be the second transistor TRs.

Second Embodiment

Figure 8:
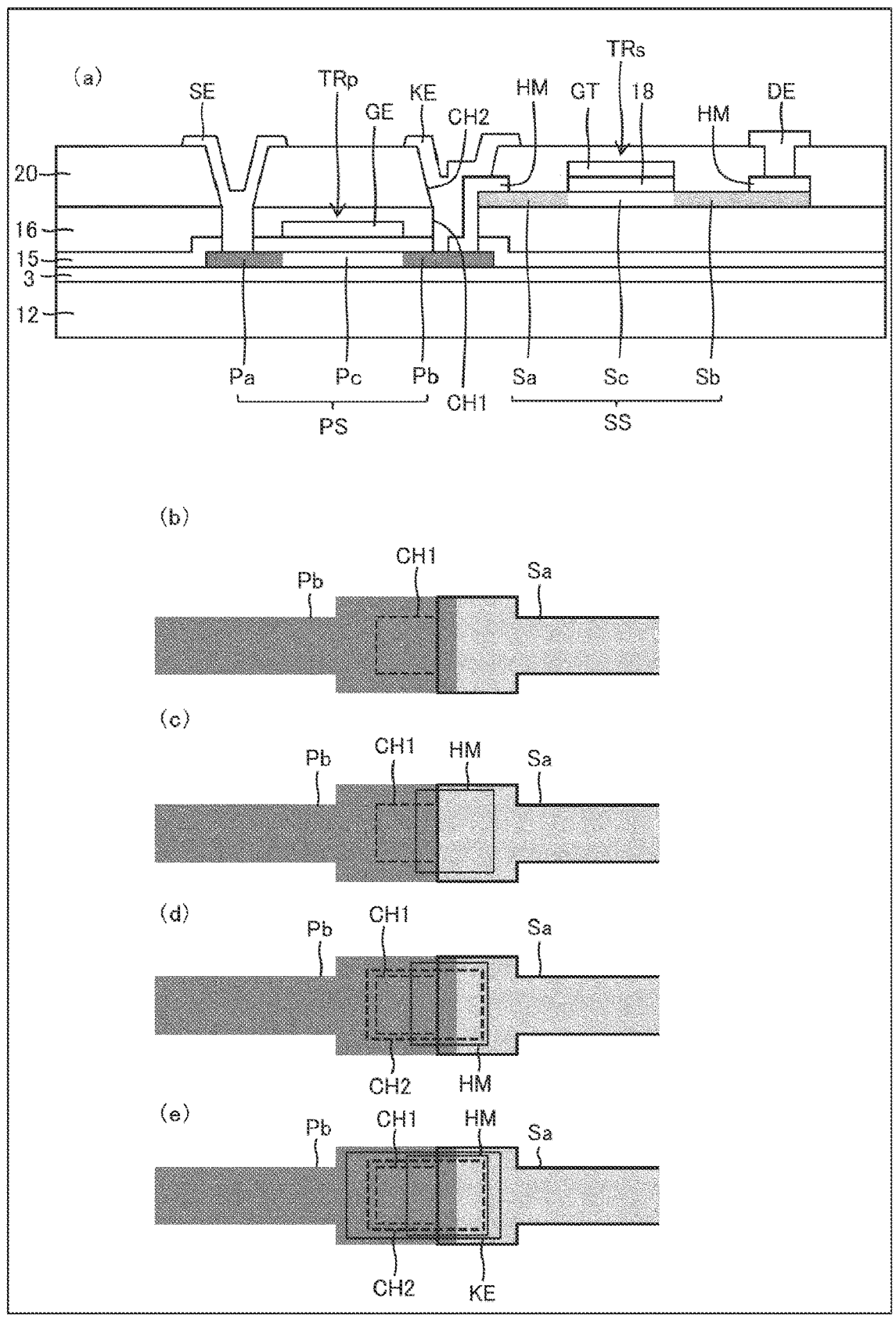
FIG. 8(a) is a cross-sectional view illustrating a configuration of a display device in a second embodiment.
FIG. 8(b) to FIG. 8(e) are plan views illustrating steps to form the display device in the second embodiment.

FIG. 8(a) is a cross-sectional view illustrating a configuration of a display device in a second embodiment. FIG. 8(b) to FIG. 8(e) are plan views illustrating steps to form the display device in the first embodiment. The display device in the second embodiment is provided with a protective metal layer HM in contact with the conductor region Sa of the oxide semiconductor layer SS. The protective metal layer HM and the connection wire KE electrically connect together the conductor region Pb of the crystalline silicon semiconductor layer PS and the conductor region Sa of the oxide semiconductor layer SS.

The protective metal layer HM is provided above the oxide semiconductor layer SS. The connection wire KE and the protective metal layer HM are in contact with the conductor region Pb, of the crystalline silicon semiconductor layer PS, exposed in the first contact hole CH1. Moreover, in the second contact hole CH2, the protective metal layer HM is in contact with the conductor region Sa of the oxide semiconductor layer SS, and with the connection wire KE.

Figure 9:
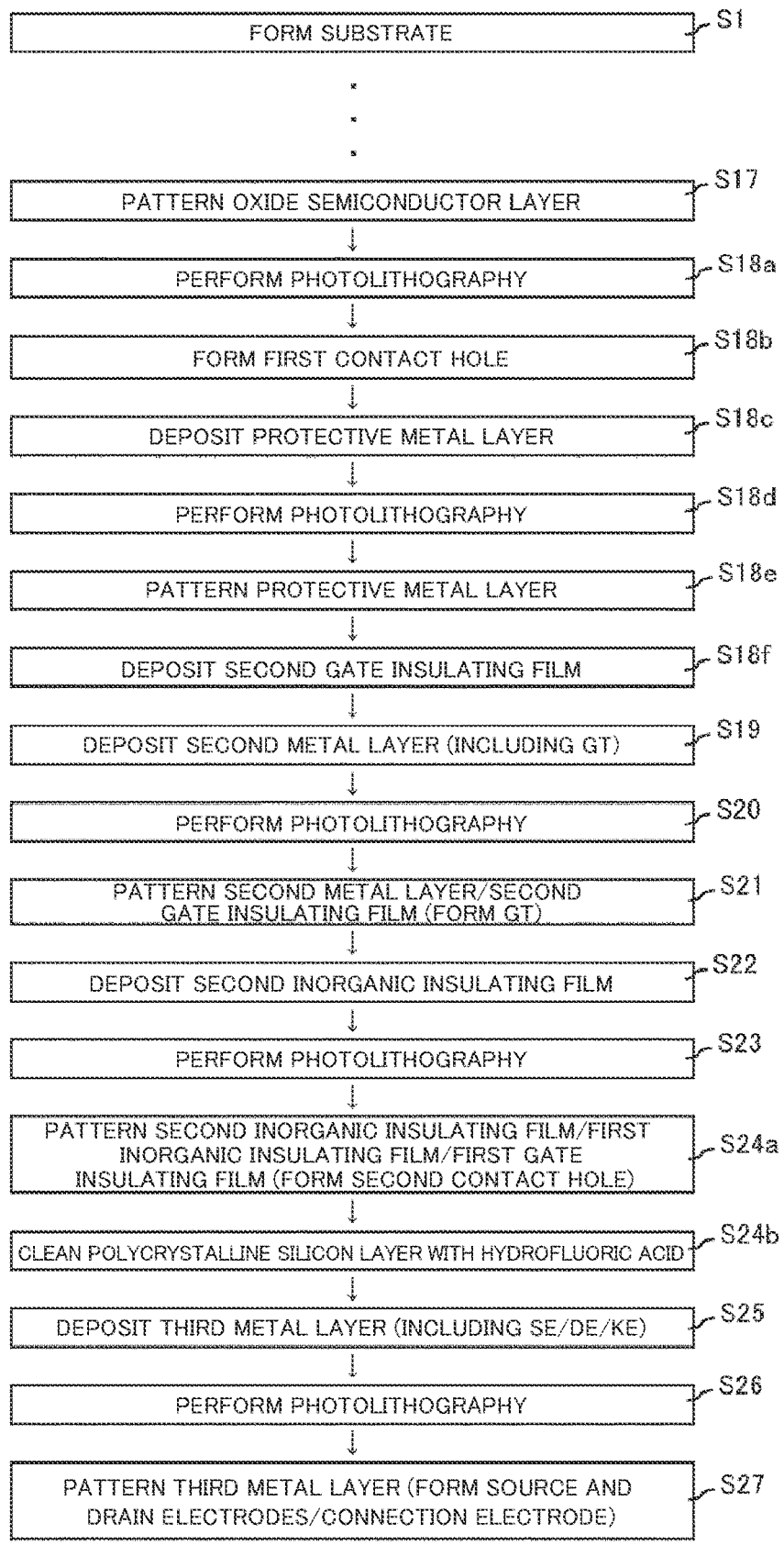
FIG. 9 is a flowchart showing how to produce the display device in the second embodiment.
Figure 10:
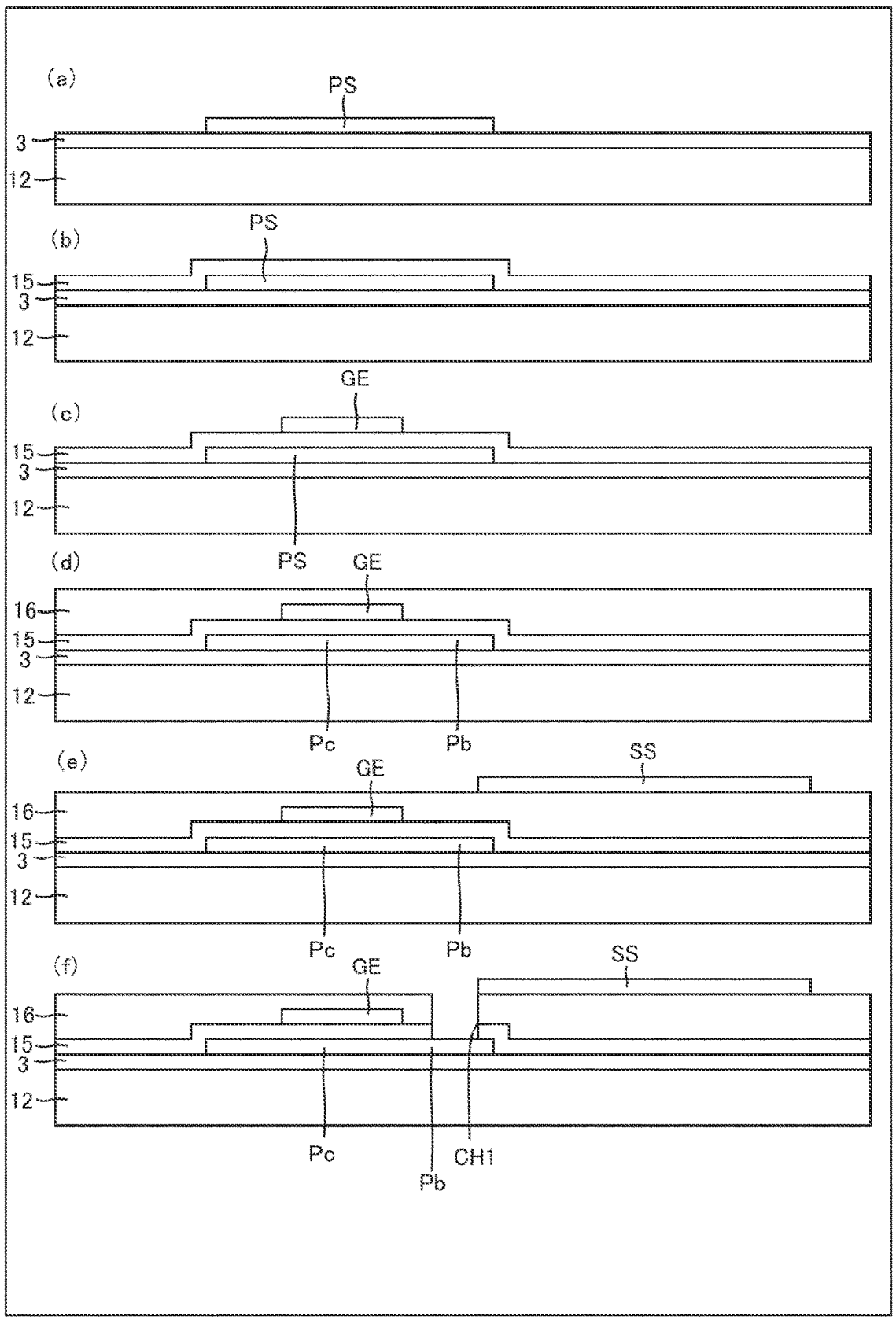
FIG. 10 is a cross-sectional view illustrating how to produce the display device in the second embodiment.
Figure 11:
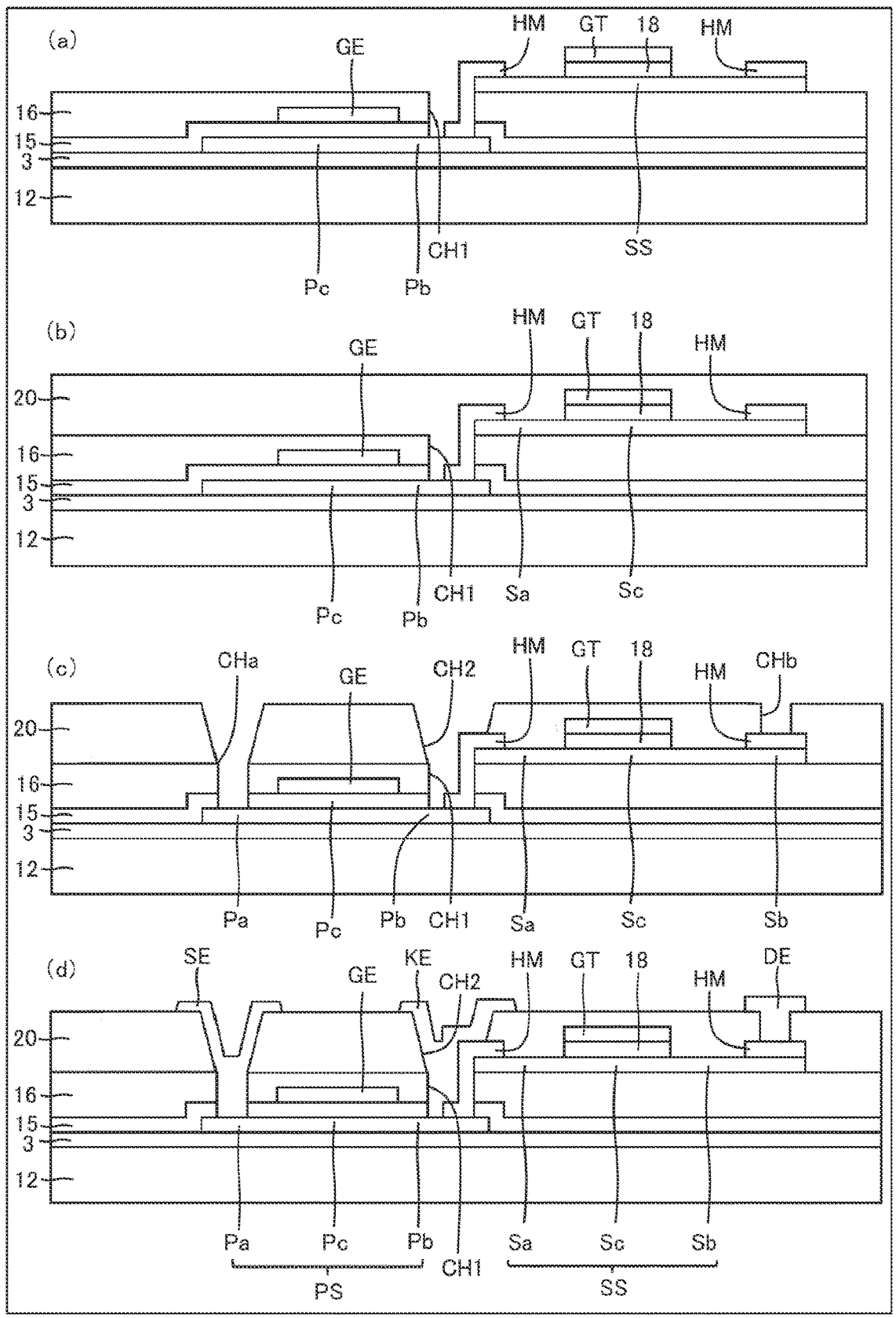
FIG. 11 is a cross-sectional view illustrating how to produce the display device in the second embodiment.

FIG. 9 is a flowchart showing how to produce the display device in the second embodiment. FIGS. 10 and 11 are cross-sectional views illustrating how to produce the display device in the second embodiment. Steps S1 to S17 are the same as those in FIG. 4 (see FIG. 10(a) to FIG. 10(e)). At Step S18a, photolithography is performed. At Step S18b, the first inorganic insulating film 16 and the first gate insulating film 15 are patterned, and the first contact hole CH1 is formed (FIG. 8(b) and FIG. 10(f)). Here, the oxide semiconductor layer SS functions as a mask so that an interior wall surface of the first contact hole CH1 is formed to be flush with an end face of the oxide semiconductor layer SS. The top face of the conductor region Pb (of the polycrystalline silicon layer) is exposed at the bottom of the first contact hole CH1.

At Step S18c, the protective metal layer HM (e.g. a molybdenum film, and a multilayer film including titanium and aluminum) is deposited. The protective metal layer HM may be made of any given metal material. Preferably, the metal material includes molybdenum and tungsten resistant to corrosion caused by cleaning with hydrofluoric acid, and an alloy of such metals. At Step S18d, photolithography is performed. At Step S18e, the protective metal layer HM is patterned (FIG. 8(c) and FIG. 11(a)). Hence, the protective metal layer HM is formed to directly cover the end of the oxide semiconductor layer SS and reach (come into contact with) the top face of the conductor region Pb (of the polycrystalline silicon layer). Note that the conductor region Pb is partially left exposed at the bottom of the contact hole CH1.

At Step S18f, the second gate insulating film 18 is deposited. At Step S19, the second metal layer (including the GT) is deposited. At Step S20, photolithography is performed. At Step S21, the second metal layer and the second gate insulating film 18 are patterned to form the second gate electrode GT (see FIG. 11(a)).

At Step S22, the second inorganic insulating film 20 is deposited (see FIG. 11(b)). Here, an end of the oxide semiconductor layer SS (i.e. a portion not facing the second gate electrode GT) is reduced to form the conductor region Sa and the channel region Sc. At Step S23, photolithography is performed.

At Step S24a, the second inorganic insulating film 20, the first inorganic insulating film 16, and the first gate insulating film 15 are patterned, and the second contact hole CH2 is formed (see FIG. 8(d) and FIG. 11(c)). Here, a top face and an end face of the protective metal layer HM and a top face of the conductor region Pb (of the polycrystalline silicon semiconductor layer PS) are exposed inside the first contact hole CH1 and the second contact hole CH2 communicating with each other. Furthermore, at Step S24a, the contact hole CHa and the contact hole CHb are formed. The contact hole CHa exposes a top face of the conductor region Pa of the polycrystalline silicon semiconductor layer PS. The contact hole CHb exposes a top face of the conductor region Sb of the oxide semiconductor layer SS.

At Step S24b, the top face, of the conductor region Pb, exposed at the bottom of the contact hole CH1 is cleaned with hydrofluoric acid. At Step S25, the third metal layer (including the SE, the DE, and the KE) is deposited. At Step S26, photolithography is performed.

At Step S27, the third metal layer is patterned (see FIG. 8(e) and FIG. 11(d)). Formed here are the source electrode SE covering the contact hole CHa, the drain electrode DE covering the contact hole CHb, and the connection wire KE covering the first contact hole CH1 and the second contact hole CH2. Hence, the connection wire KE comes into contact with the top face of the conductor region Pb, and with the end face and the top face of the protective metal layer HM. Thus, the protective metal layer HM and the connection wire KE electrically connect together the conductor region Pb and the conductor region Sa.

At Step S24b in the second embodiment, the conductor region Pb (of the polycrystalline silicon layer PS) is cleaned with hydrofluoric acid. Such a feature makes it possible to remove a native oxide layer on the top face of the conductor region Pb, and to reduce contact resistance between the conductor region Pb and the connection wire KE. The end of the conductor region Sa of the oxide semiconductor layer SS is covered with the protective metal layer HM. Such a feature makes it possible to overcome a problem of damage to be inflicted on the conductor region Sa of the oxide semiconductor layer SS when the conductor region Sa is cleaned with hydrofluoric acid.

FIG. 12(a) is a cross-sectional view illustrating another configuration of the display device in the second embodiment. FIG. 12(b) to FIG. 12(f) are plan views illustrating steps to form the display device in FIG. 12(a).

In the display device of FIG. 12(a), the protective metal layer HM is provided below the oxide semiconductor layer SS. The conductor region Sa of the oxide semiconductor layer SS is provided with the first opening Hf matching the second contact hole CH2. The protective metal layer HM exposed in the first opening Hf is in contact with the connection wire KE. Moreover, the protective metal layer HM exposed in the first opening Hf is provided with a second opening Hs matching the first contact hole CH1.

Figure 12:
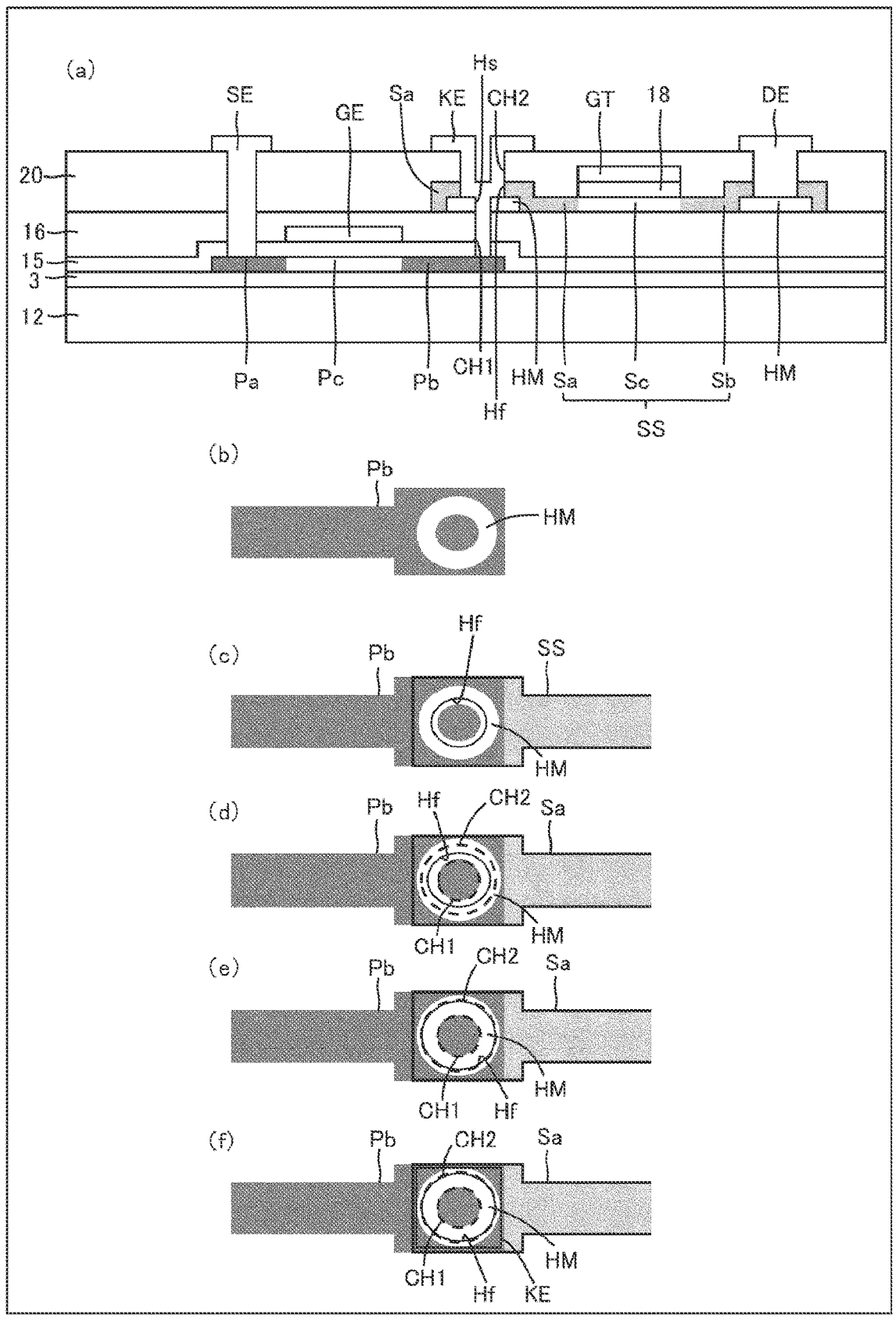
FIG. 12(a) is a cross-sectional view illustrating another configuration of the display device in the second embodiment.
FIG. 12(b) to FIG. 12(f) are plan views illustrating steps to form the display device in FIG. 12(a).
Figure 13:
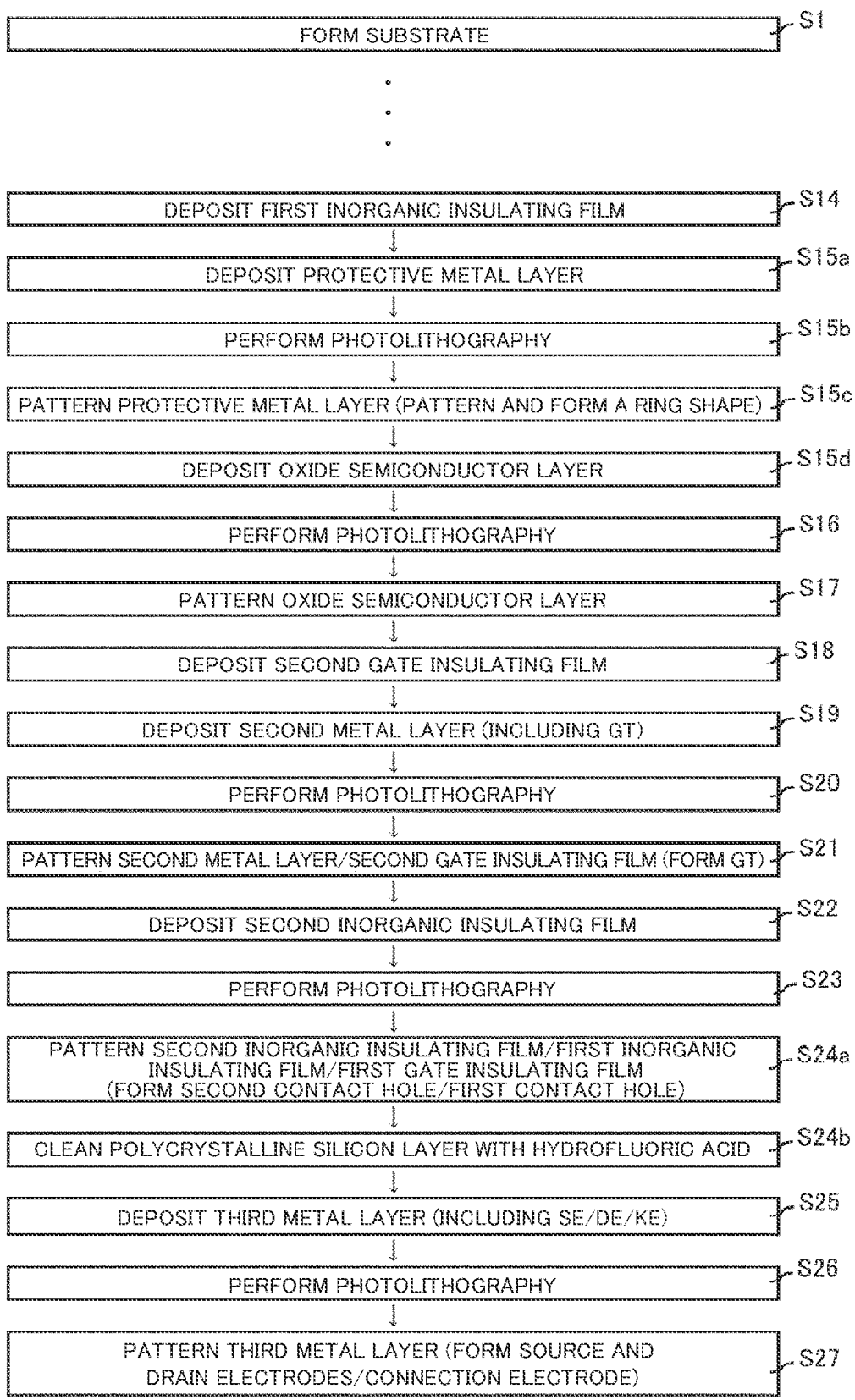
FIG. 13 is a flowchart showing how to produce the display device in FIG. 12(a).

FIG. 13 is a flowchart showing how to produce the display device in FIG. 12(a). Steps S1 to S14 are the same as those in FIG. 4. At Step S15a, the protective metal layer HM is deposited. At Step S15b, photolithography is performed. At Step S15c, the protective metal layer HM is patterned and shaped into a ring. The protective metal layer HM is formed to overlap the conductor region Pb of the crystalline silicon semiconductor layer PS (see FIG. 12(b)). At Step S15d, the oxide semiconductor layer SS is deposited. At Step S16, photolithography is performed. At Step S17, the oxide semiconductor layer SS is patterned. Here, the first opening Hf is formed at an end, of the oxide semiconductor layer SS, directly covering the protective metal layer HM shaped into a ring, to overlap the protective metal layer HM (see FIG. 12(c)).

At Step S18, the second gate insulating film 18 is deposited. At Step S19, the second metal layer (including the GT) is deposited. At Step S20, photolithography is performed. At Step S21, the second metal layer and the second gate insulating film 18 are patterned to form the second gate electrode GT.

At Step S22, the second inorganic insulating film 20 is deposited. Here, an end of the oxide semiconductor layer SS (i.e. a portion not facing the second gate electrode GT) is reduced to form the conductor region Sa and the channel region Sc. At Step S23, photolithography is performed.

At Step S24a, the second inorganic insulating film 20, the first inorganic insulating film 16, and the first gate insulating film 15 are patterned. Hence, the first contact hole CH1 is formed to match the inner periphery of the protective metal layer HM shaped into a ring, and the second contact hole CH2 is formed to surround the first opening Hf in plan view (see FIG. 12(d)).

The inner periphery of the protective metal layer HM and the first contact hole CH1 match because, when the first contact hole CH1 is formed, the protective metal layer HM provided with the second opening Hs substantially acts as a mask for forming the first contact hole CH1 in the first gate insulating film 15 and the first inorganic insulating film 16. Hence, the matching here does not mean precise matching between the inner periphery of the protective metal layer HM and the first contact hole CH1, and allows a displacement ranging from approximately 1 to 3 μm due to a difference in etching rate.

At Step S24b, the top face, of the conductor region Pb, exposed at the bottom of the contact hole CH1 is cleaned with hydrofluoric acid. Hence, the first opening Hf becomes larger to match the second contact hole CH2 (see FIG. 12(e)). In the matching here, the second contact hole CH2 is masked, and the first opening Hf is etched and formed by cleaning with hydrofluoric acid. Thus, the matching here does not mean precise matching of the first opening Hf with the second contact hole CH2, and allows a displacement ranging from approximately 1 to 3 μm due to a difference in etching rate.

At Step S25, the third metal layer (including the SE, the DE, and the KE) is deposited. At Step S26, photolithography is performed. At Step S27, the third metal layer is patterned (see FIG. 12(f)). Formed here is the connection wire KE covering the first contact hole CH1 and the second contact hole CH2. Hence, the connection wire KE comes into contact with the top face of the conductor region Pb, and with the end face and the top face of the protective metal layer HM. Thus, the protective metal layer HM and the connection wire KE electrically connect together the conductor region Pb and the conductor region Sa.

In the case shown in FIGS. 12 and 13, at Step S24b, the conductor region Pb (of the polycrystalline silicon layer PS) is cleaned with hydrofluoric acid. Such a feature makes it possible to remove a native oxide layer on the top face of the conductor region Pb, and to reduce contact resistance between the conductor region Pb and the connection wire KE. The conductor region Sa of the oxide semiconductor layer SS is provided with the first opening Hf through which the connection wire KE and the protective metal layer HM come into contact with each other. Such a feature ensures electrical connection between the conductor region Sa and the conductor region Pb.

Figure 14:
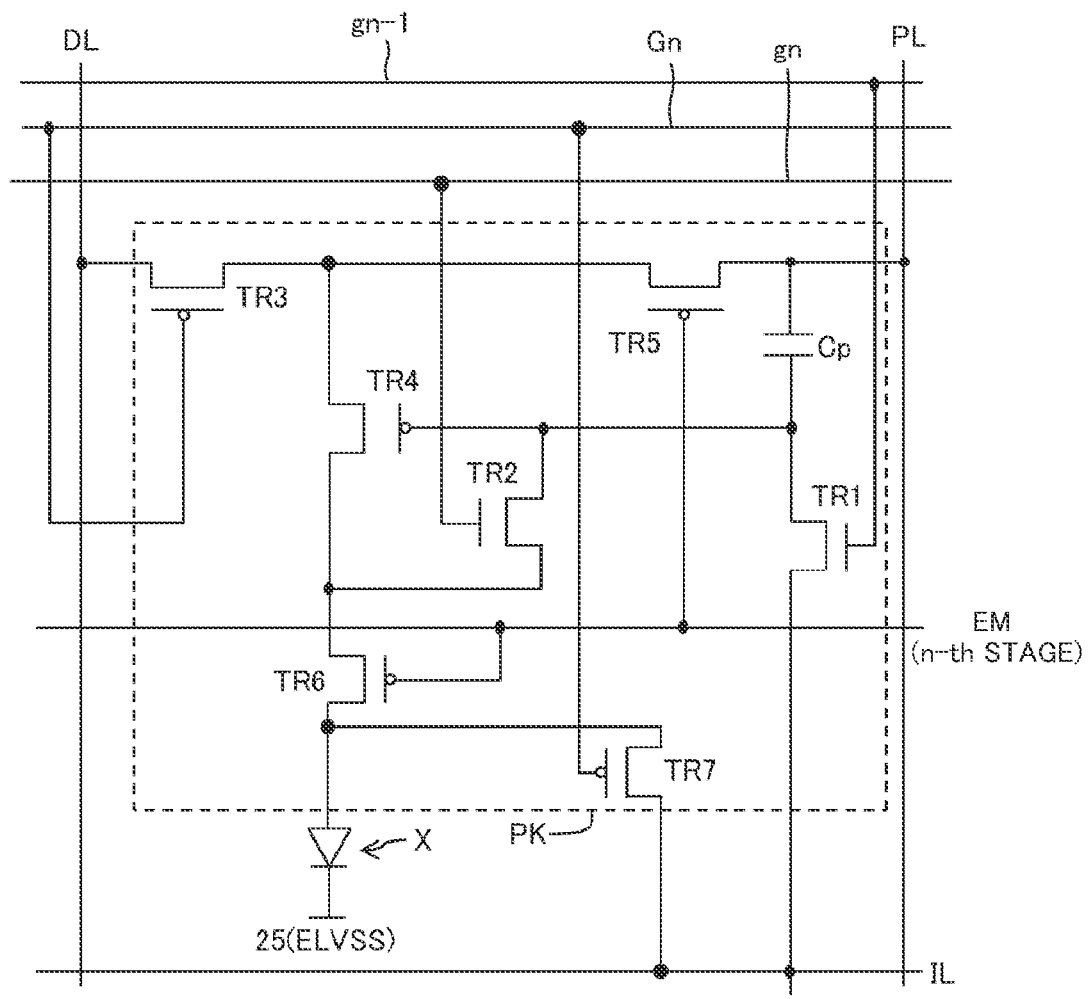
FIG. 14 is a circuit diagram illustrating another example of the pixel circuit.

Each of the embodiments may utilize a pixel circuit illustrated in FIG. 14. The pixel circuit PK in FIG. 14 includes: the capacitance element Cp; the first initialization transistor TR1 having the gate terminal connected to a can signal line gn−1 at a previous stage (n−1-th stage); the threshold control transistor TR2 having the gate terminal connected to a scan signal line gn at the stage of the threshold control transistor TR2 itself (n-th stage); the write control transistor TR3 having the gate terminal connected to the scan signal line Gn at the stage of the write control transistor TR3 itself (n-th stage); the drive transistor TR4 controlling a current of the light-emitting element X; the power source supply transistor TR5 having the gate terminal connected to the light-emission control line EM (n-th stage); the light-emission control transistor TR6 having the gate terminal connected to the light-emission control line EM (n-th stage); and the second initialization transistor TR7 having the gate terminal connected to the scan signal line Gn at the stage of the second initialization transistor TR7 itself (n-th stage).

The drive transistor TR4 has the gate terminal connected to the high-voltage power source line PL through the capacitance element Cp, and to the initialization power source line IL through the first initialization transistor TR1. The drive transistor TR4 has the source terminal connected to the data signal line DL through the write control transistor TR3, and to the high-voltage power source line PL through the power source supply transistor TR5. The drive transistor TR4 has the drain terminal connected to the anode of the light-emitting element X through the light-emission control transistor TR6, and to the gate terminal of the drive transistor TR4 through the threshold control transistor TR2. The anode of the light-emitting element X is connected to the initialization power source line IL through the second initialization transistor TR7. The initialization power source line IL and the cathode 25 (a common electrode) of the light-emitting element X are supplied with, for example, the same low-voltage power supply (ELVSS).

In the pixel circuit PK illustrated in FIG. 14, for example, the drive transistor TR4 may be the first transistor TRp, of the p-type, having a channel of the crystalline silicon semiconductor layer PS. The first initialization transistor TR1 and the threshold control transistor TR2 to be connected to the capacitance element Cp may be, for example, the second transistor TRs, of the n-type, having a channel of the oxide semiconductor layer SS.

The above embodiments are intended for exemplification and description, and not for limitation, of the disclosure. It is apparent for those skilled in the art that many modifications are available in accordance with the exemplification and description.

First Aspect

A display device includes: a first transistor; a second transistor; a first inorganic insulating film; and a second inorganic insulating film, all of which are provided above a substrate.

The first transistor includes: a crystalline silicon semiconductor layer; a first gate insulating film provided on the crystalline silicon semiconductor layer; and a first gate electrode provided on the first gate insulating film, and positioned across the first gate insulating film from the crystalline silicon semiconductor layer.

The second transistor includes: an oxide semiconductor layer; a second gate insulating film provided on the oxide semiconductor layer; and a second gate electrode provided on the second gate insulating film, and positioned across the second gate insulating film from the oxide semiconductor layer.

The first inorganic insulating film is provided on the first gate insulating film and the first electrode, and is positioned below the oxide semiconductor layer.

The second inorganic insulating film is provided on the first inorganic insulating film and the oxide semiconductor layer, and is positioned above the second gate electrode.

The first gate insulating film and the first inorganic insulating film are provided with a first contact hole.

The second inorganic insulating film is provided with a second contact hole surrounding the first contact hole in plan view.

The first contact hole and the second contact hole are provided with a connection wire, and are in shared use between the first transistor and the second transistor. The connection wire electrically connects together one of conductor regions of the crystalline silicon semiconductor layer in the first transistor and one of conductor regions of the oxide semiconductor layer in the second transistor.

Second Aspect In the display device according to, for example, the first aspect, the connection wire is in contact with: the one conductor region, of the crystalline silicon semiconductor layer, exposed in the first contact hole; and the one conductor region, of the oxide semiconductor layer, exposed in the second contact hole.

Third Aspect

In the display device according to, for example, the second aspect, the oxide semiconductor layer exposed in the second contact hole is provided with a first opening matching the first contact hole.

Fourth Aspect

The display device according to claim 1 or 2, further includes a protective metal layer in contact with the one conductor region of the oxide semiconductor layer.

The protective metal layer and the connection wire electrically connect together the one conductor region of the crystalline silicon semiconductor layer in the first transistor and the one conductor region of the oxide semiconductor layer in the second transistor.

Fifth Aspect

In the display device according to, for example, the fourth aspect, the protective metal layer is provided above the oxide semiconductor layer, and the connection wire and the protective metal layer are in contact with the one conductor region, of the crystalline silicon semiconductor layer, exposed in the first contact hole.

Sixth Aspect

In the display device according to, for example, the fifth aspect, in the second contact hole, the oxide semiconductor layer is in contact with the protective metal layer, and with the connection wire.

Seventh Aspect

In the display device according to, for example, the sixth aspect, the protective metal layer is provided below the oxide semiconductor layer, and the oxide semiconductor layer is provided with a first opening matching the second contact hole.

The protective metal layer exposed in the first opening is in contact with the connection wire.

Eighth Aspect

In the display device according to, for example, the seventh aspect, the protective metal layer exposed in the first opening is provided with a second opening matching the first contact hole.

Ninth Aspect

The display device according to, for example, any one of the first to eighth aspects further includes: a light-emitting element; and a pixel circuit including a capacitance element, a drive transistor controlling a current of the light-emitting element, and a threshold control transistor having one of conducting terminals connected to the capacitance element.

The drive transistor is the first transistor of an n-type.

The threshold control transistor is the second transistor of the n-type, and has another one of the conducting terminals connected to the drive transistor.

Tenth Aspect

In the display device according to, for example, the ninth aspect, the pixel circuit includes an initialization transistor having one of conducting terminals connected to the capacitance element.

The initialization transistor is the second transistor of the n-type, and has another one of the conducting terminals connected to a power source line.

Eleventh Aspect

In the display device according to any one of the first to tenth aspects, the connection wire formed above the oxide semiconductor layer is disposed inside the first contact hole and the second contact hole communicating with each other.

The one conductor region of the crystalline silicon semiconductor layer is in contact with the connection wire.

The connection wire is in contact with either the one conductor region of the oxide semiconductor region, or a protective metal layer covering an end face of the one conductor region of the oxide semiconductor layer.

Twelfth Aspect

In the display device according to any one of the first to eighth aspects, the first transistor is of a p-type, and the second transistor is of an n-type.

Thirteenth Aspect

The display device according to, for example, the twelfth aspect further includes a pixel circuit including: a capacitance element; a drive transistor acting as the first transistor, and having a control terminal connected to the capacitance element; and the second transistor connected to the capacitance element.

Fourteenth Aspect

The display device according to, for example, the thirteenth aspect further includes a data signal line formed in the same layer as the connection wire is.

The invention claimed is:

1. A display device, comprising:
a first transistor; a second transistor; a first inorganic insulating film; and a second inorganic insulating film, all of which are provided above a substrate,
the first transistor including: a crystalline silicon semiconductor layer; a first gate insulating film provided on the crystalline silicon semiconductor layer; and a first gate electrode provided on the first gate insulating film, and positioned across the first gate insulating film from the crystalline silicon semiconductor layer,
the second transistor including: an oxide semiconductor layer; a second gate insulating film provided on the oxide semiconductor layer; and a second gate electrode provided on the second gate insulating film, and positioned across the second gate insulating film from the oxide semiconductor layer,
the first inorganic insulating film being provided on the first gate insulating film and the first gate electrode, and being positioned below the oxide semiconductor layer,
the second inorganic insulating film being provided on the first inorganic insulating film and the oxide semiconductor layer, and being positioned above the second gate electrode,
the first gate insulating film and the first inorganic insulating film being provided with a first contact hole,
the second inorganic insulating film being provided with a second contact hole surrounding the first contact hole in plan view, and
the first contact hole and the second contact hole being provided with a connection wire, and being in shared use between the first transistor and the second transistor, the connection wire electrically connecting together one of conductor regions of the crystalline silicon semiconductor layer in the first transistor and one of conductor regions of the oxide semiconductor layer in the second transistor.

2. The display device according to claim 1, wherein
the connection wire is in contact with: the one conductor region, of the crystalline silicon semiconductor layer, exposed in the first contact hole; and the one conductor region, of the oxide semiconductor layer, exposed in the second contact hole.

3. The display device according to claim 2, wherein
the oxide semiconductor layer exposed in the second contact hole is provided with a first opening matching the first contact hole.

4. The display device according to claim 1, further comprising
a protective metal layer in contact with the one conductor region of the oxide semiconductor layer, wherein
the protective metal layer and the connection wire electrically connect together the one conductor region of the crystalline silicon semiconductor layer in the first transistor and the one conductor region of the oxide semiconductor layer in the second transistor.

5. The display device according to claim 4, wherein
the protective metal layer is provided above the oxide semiconductor layer, and the connection wire and the protective metal layer are in contact with the one conductor region, of the crystalline silicon semiconductor layer, exposed in the first contact hole.

6. The display device according to claim 5, wherein
in the second contact hole, the oxide semiconductor layer is in contact with the protective metal layer, and with the connection wire.

7. The display device according to claim 6, wherein
the protective metal layer is provided below the oxide semiconductor layer, and the oxide semiconductor layer is provided with a first opening matching the second contact hole, and
the protective metal layer exposed in the first opening is in contact with the connection wire.

8. The display device according to claim 7, wherein
the protective metal layer exposed in the first opening is provided with a second opening matching the first contact hole.

9. The display device according to claim 1, further comprising:
a light-emitting element; and
a pixel circuit including a capacitance element, a drive transistor configured to control a current of the light-emitting element, and a threshold control transistor having one of conducting terminals connected to the capacitance element, wherein
the drive transistor is the first transistor of an n-type, and
the threshold control transistor is the second transistor of the n-type, and has another one of the conducting terminals connected to the drive transistor.

10. The display device according to claim 9, wherein
the pixel circuit includes an initialization transistor having one of conducting terminals connected to the capacitance element, and
the initialization transistor is the second transistor of the n-type, and has another one of the conducting terminals connected to a power source line.

11. The display device according to claim 1, wherein
the connection wire formed above the oxide semiconductor layer is disposed inside the first contact hole and the second contact hole communicating with each other,
the one conductor region included in the crystalline silicon semiconductor layer is in contact with the connection wire, and
the connection wire is in contact with either the one conductor region included in the oxide semiconductor region, or a protective metal layer covering an end face of the one conductor region included in the oxide semiconductor layer.

12. The display device according to claim 1, wherein
the first transistor is of a p-type, and the second transistor is of an n-type.

13. The display device according to claim 12, further comprising
a pixel circuit including: a capacitance element; a drive transistor acting as the first transistor, and having a control terminal connected to the capacitance element; and the second transistor connected to the capacitance element.

14. The display device according to claim 13, further comprising
a data signal line formed in a same layer as the connection wire is.

* * * * *